(12) United States Patent
Ruzic et al.

(10) Patent No.: US 9,867,269 B2
(45) Date of Patent: Jan. 9, 2018

(54) SCALABLE MULTI-ROLE SURFACE-WAVE PLASMA GENERATOR

(71) Applicant: Starfire Industries, LLC, Champaign, IL (US)

(72) Inventors: David N. Ruzic, Pesotum, IL (US); Robert A. Stubbers, Champaign, IL (US); Brian E. Jurczyk, Champaign, IL (US)

(73) Assignee: STARFIRE INDUSTRIES, LLC, Champaign, IL (US)

( * ) Notice: Subject to any disclaimer, the term of this patent is extended or adjusted under 35 U.S.C. 154(b) by 392 days.

(21) Appl. No.: 14/217,342

(22) Filed: Mar. 17, 2014

(65) Prior Publication Data

US 2014/0315347 A1   Oct. 23, 2014

Related U.S. Application Data

(60) Provisional application No. 61/792,803, filed on Mar. 15, 2013, provisional application No. 61/822,971, filed on May 14, 2013.

(51) Int. Cl.
*H01L 21/00* (2006.01)
*H05H 1/46* (2006.01)
*H01L 31/18* (2006.01)
*H01L 21/67* (2006.01)

(52) U.S. Cl.
CPC ............ *H05H 1/46* (2013.01); *H01L 31/18* (2013.01); *H01L 21/67017* (2013.01); *H01L 21/67155* (2013.01); *H05H 2001/463* (2013.01); *H05H 2001/4615* (2013.01)

(58) Field of Classification Search
CPC ............ H05H 1/46; H05H 2001/463; H05H 2001/4615; H01L 31/18
USPC ........................................................ 438/94
See application file for complete search history.

(56) References Cited

U.S. PATENT DOCUMENTS

| | | | |
|---|---|---|---|
| 3,779,864 A | 12/1973 | Dawson | |
| 5,204,272 A | 4/1993 | Guha et al. | |
| 5,466,991 A * | 11/1995 | Berry | H01J 37/32192 118/723 MW |
| 5,996,528 A | 12/1999 | Berrian et al. | |

(Continued)

OTHER PUBLICATIONS

International Search Report and Written Opinion for co-pending International Application No. PCT/US2014/030877 dated Sep. 11, 2014.

(Continued)

*Primary Examiner* — Vu A Vu
(74) *Attorney, Agent, or Firm* — Leydig, Voit & Mayer, Ltd.

(57) ABSTRACT

Systems and methods are described herein for generating surface-wave plasmas capable of simultaneously achieving high density with low temperature and planar scalability. A key feature of the invention is reduced damage to objects in contact with the plasma due to the lack of an RF bias; allowing for damage free processing. The preferred embodiment is an all-in-one processing reactor suitable for photovoltaic cell manufacturing, performing saw-damage removal, oxide stripping, deposition, doping and formation of heterostructures. The invention is scalable for atomic-layer deposition, etching, and other surface interaction processes.

28 Claims, 10 Drawing Sheets

(56) References Cited

U.S. PATENT DOCUMENTS

| | | | |
|---|---|---|---|
| 6,136,722 A * | 10/2000 | Nambu | H01L 21/31116 |
| | | | 216/79 |
| 6,177,148 B1 * | 1/2001 | Walther | C23C 16/402 |
| | | | 118/723 MW |
| 6,287,980 B1 | 9/2001 | Hanazaki et al. | |
| 6,781,087 B1 * | 8/2004 | Chism, Jr. | H05H 1/36 |
| | | | 219/121.48 |
| 6,949,165 B2 | 9/2005 | Koshimizu | H01J 37/32623 |
| | | | 156/345.43 |
| 6,953,005 B2 | 10/2005 | Suzuki | |
| 7,518,092 B2 * | 4/2009 | Purta | B01J 8/0257 |
| | | | 219/695 |
| 8,324,085 B2 | 4/2012 | Lee et al. | |
| 8,307,781 B2 | 11/2012 | Suzuki | |
| 8,558,169 B2 * | 10/2013 | Hori | G01N 27/622 |
| | | | 250/281 |
| 2003/0234355 A1 | 12/2003 | Leung et al. | |
| 2005/0090078 A1 * | 4/2005 | Ishihara | H01J 37/32192 |
| | | | 438/471 |
| 2007/0266350 A1 * | 11/2007 | Fulga | G01R 31/2822 |
| | | | 716/132 |
| 2008/0038926 A1 | 2/2008 | Ventzek et al. | |
| 2008/0264480 A1 | 10/2008 | Choi et al. | |
| 2010/0029038 A1 | 2/2010 | Murakawa | |
| 2010/0099244 A1 | 4/2010 | Rouh et al. | |
| 2010/0101728 A1 * | 4/2010 | Iwasaki | H01J 37/32192 |
| | | | 156/345.33 |
| 2010/0178775 A1 * | 7/2010 | Okesaku | C23C 16/45565 |
| | | | 438/726 |
| 2011/0044418 A1 | 2/2011 | Stubbers et al. | |
| 2011/0057562 A1 | 3/2011 | Chen et al. | |
| 2011/0135842 A1 | 6/2011 | Faguet et al. | |
| 2012/0049415 A1 * | 3/2012 | George | H05B 6/686 |
| | | | 264/432 |
| 2012/0138139 A1 | 6/2012 | Cho | |
| 2012/0228261 A1 * | 9/2012 | Watanabe | G03F 7/40 |
| | | | 216/41 |
| 2013/0109189 A1 * | 5/2013 | Cho | H01L 31/18 |
| | | | 438/710 |
| 2013/0256272 A1 | 10/2013 | Zhao et al. | |
| 2013/0264938 A1 | 10/2013 | Chen et al. | |
| 2013/0270997 A1 | 10/2013 | Zhao et al. | |

OTHER PUBLICATIONS

International Preliminary Report for co-pending International Application No. PCT/US2014/030877 dated Sep. 24, 2015.

* cited by examiner

SCALABLE MULTI-ROLE SURFACE-WAVE PLASMA GENERATOR

CROSS-REFERENCE TO RELATED APPLICATIONS

This application claims benefit to U.S. Provisional Application Ser. No. 61/792,803, filed on Mar. 15, 2013, and to U.S. Provisional Application Ser. No. 61/822,971, filed on May 14, 2013, the contents of which are expressly incorporated herein by reference in their entirety including the contents and teachings of any references contained therein.

STATEMENT REGARDING FEDERALLY SPONSORED RESEARCH OR DEVELOPMENT

The United States Government may have certain rights in the invention pursuant to contract number IIP-127557 awarded by the National Science Foundation under the Small Business Innovative Research Program.

FIELD OF THE INVENTION

This invention relates to plasma generators, and in particular to surface-wave plasma generators for thin-film processing and photovoltaic manufacturing.

BACKGROUND OF THE INVENTION

Solar photovoltaic arrays, often referred to as solar panels, convert solar radiation into electricity. The costliest and most time-consuming process involved in the manufacture of thin-film silicon photovoltaics is thin-film deposition. For high volume manufacturing applications, thin-film deposition is often accomplished through a plasma-enhanced chemical vapor deposition (PECVD) process. However, current PECVD processes are limited by slow thin-film deposition rates, roughly one nanometer per second, and moreover, are often unable to eliminate thin-film defects that dramatically decrease solar conversion efficiency.

Most current PECVD processes utilize capacitive radiofrequency (RF) discharge plasma reactors. However, capacitive RF discharge plasma reactors exhibit numerous undesirable features when scaled to large sizes and high power, including large transient voltages, discharge non-uniformities, and generation of arcs and surface defects between active parallel plates. Therefore, in order to limit undesirable plasma characteristics, capacitive RF discharge plasma systems are operated at relatively low plasma density (e.g. $10^{10}$ $cm^{-3}$) thereby severely limiting rates of plasma-enhanced chemical vapor deposition (PECVD) and plasma etching. Microwave plasma sources can be operated at considerably higher densities (e.g. $10^{12}$ $cm^{-3}$) but nevertheless exhibit their own undesirable characteristics, which include engineering difficulties associated with scaling the devices to large sizes, plasma non-uniformities, and instability at high deposition rates.

SUMMARY OF THE INVENTION

A surface-wave plasma source comprising a microwave launch structure, a dielectric insulator, a conducting baseplate, an impedance matching feedthrough, and a microwave generator configured to supply electromagnetic energy at a particular frequency to the plasma region.

A method for using a surface-wave plasma source for high-throughput processing of photovoltaic solar cells employing one or more of the following plasma processing steps: bulk saw damage removal etching, nano-scale surface texturing, surface cleaning, intrinsic, emitter and collector deposition, and heterojunction layering in a single vacuum chamber/platform.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION OF THE INVENTION

Figure 1:
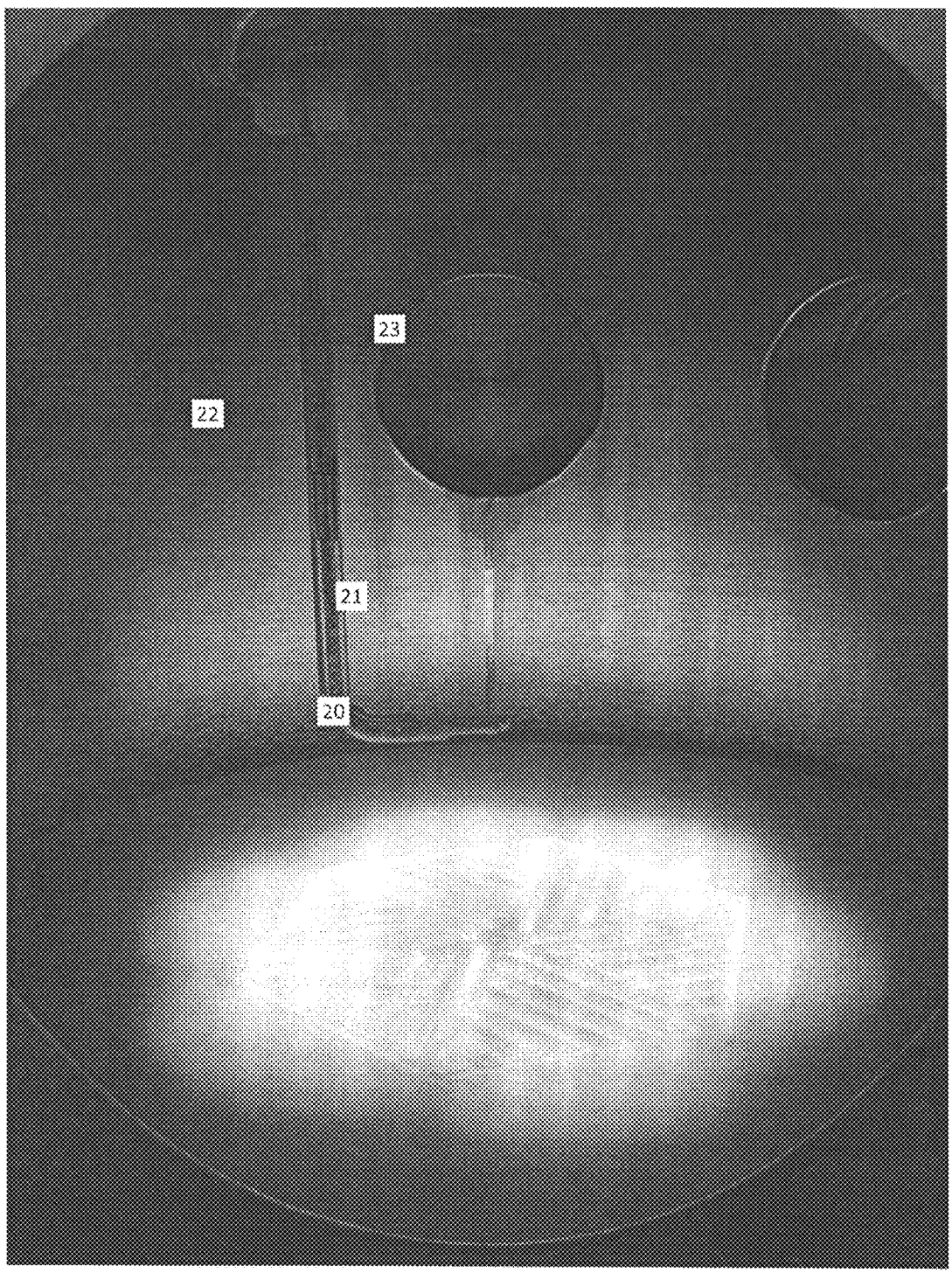
FIG. 1 depicts a surface-wave plasma extending radially outward from a microwave launch structure.

Photovoltaic fabrication techniques that reduce production costs while producing photovoltaic cells that exhibit increased energy conversion efficiency have the potential to dramatically increase the economic viability of solar energy.

The a-Si/c-Si heterojunction cell concept first developed by Sanyo in the 1990s is a promising candidate for future photovoltaic manufacturing, because it has demonstrated high efficiency, fewer manufacturing steps and low thermal budget. However, current heterojunction manufacturing processes involve obtaining raw, wire-sawed, n-type solar wafers and (1) performing conventional wet chemical saw damage removal, basic pyramidal texturing, and special surface cleaning steps, (2) performing front side i/p+ (front) a-Si deposition and backside i/n+ a-Si deposition via PECVD processes, (3) performing bifacial TCO sputtering, and (4) performing bifacial screening printing to place front and backside electrodes. However, such techniques present a number of challenges. First, the wet chemical texturing process cannot produce good antireflection and light trapping capabilities as well as clean textured surfaces. Second, extremely clean surfaces are required for thin (e.g. 5-20 nm) intrinsic a-Si layer deposition. However, there is a transition in the ambient environment between steps (1) and (2) that frequently results in contamination and native oxide formation causing poor band-bending effects. Third, epitaxial growth of the intrinsic a-Si layer results in poor heterojunction formation. Fourth, crystalline defects formed during bifacial thin film deposition. Eliminating wet chemical processing and bulk chemical/water usage is extremely important for photovoltaic processing in remote dry areas for economically-viable manufacturing.

Early work with microwave surface wave systems was carried out in the 1980s using a cylindrical cavity resonator and radial slot injection, including the Surfatron and other configurations. In the mid-1990s, a new planar configuration was introduced at Nagoya and Tohoku Universities. These 2.45 GHz magnetron systems launched microwaves at 1-2 kW into a vacuum chamber. The systems were initially plagued with instabilities, erratic mode shifts, and density non-uniformities. An improvement occurred with the introduction of a waveguide launch structure into the vacuum chamber to direct the microwave energy supplied from the waveguide. Plasma could be obtained with good stability either by injecting microwave energy into the plasma through a dielectric barrier (e.g. such as quartz) or by directly feeding a metal electrode. However, scalability to large-area processing was not obtained and there was substantial non-uniformity due to a large number of electric field nodes at high frequency, e.g. 2.45 GHz.

Microwave-plasma systems offer a different form of power coupling through electromagnetic radiation. Traditional electron cyclotron resonance and magnetic confinement geometries have been the mainstay for over 50 years. However, these systems are limited in size, scope, and application due to the complex magnetic fields and plasma structure. Scalability for large-area planar sources is difficult and these systems can have very high electron temperatures and sheath voltages, which can damage underlying films and materials.

A different form of microwave-plasma coupling, called surface-wave plasmas, addresses a number of these issues. Sheath voltages can be held low enough to prevent damage if plasma density is high and temperature is low. With microwave coupling, the substrate is not part of the plasma generation circuit, i.e., it is not an opposing electrode or grounded surface for capacitive coupling. Reduction in plasma potential in microwave surface wave plasma is aided by confinement of the microwave energy near the launch structure because the microwave energy propagates along the plasma surface near the launch structure and does not penetrate to the substrate nor generate a DC bias capable of causing ions to accelerate into the substrate. The microwave energy is confined because the plasma density exceeds the critical density at which collective electron actions cancel the incident electromagnetic wave near the surface of the plasma.

Surface wave plasma sources are described herein for producing high density surface wave plasmas, e.g. surface-wave plasmas with densities greater than $10^{12}$ cm$^{-3}$ (roughly one hundred times greater than the plasma density provided by conventional capacitive RF discharge plasma reactors). The increase in plasma density provided by surface wave plasma sources described herein allows for a reduction in the cost and duration of plasma processing techniques. Surface wave plasma sources described herein are able to achieve extremely low electron temperatures ($T_e$) of less than 2 eV as a result of tangential electron energy absorption along an interface between a bulk plasma and a plasma sheath. Surface wave plasma sources described herein are capable of operating with very low sheath potentials as a result of low electron temperatures coupled with a high concentration of free electrons $n_e$. Such operating conditions facilitate production of a plasma suitable for high-quality etching and deposition. Surface wave plasma sources described herein also allow process substrates to be decoupled from the plasma generator and thereby permit lower deposition temperatures for a wider range of substrates. Surface wave plasma sources described herein also allow for close energy coupling between the surface wave plasma and microwave launchers to minimize recombination at high operation pressures. Surface wave plasma sources described herein allow for scalable microwave injection over relatively large planar areas through simple phase-loop control (e.g. microwave injection over planar areas exceeding one square meter).

An array of plasma source nodes is described herein where each node has an independent electromagnetic (EM) resonator, e.g. a microwave antenna or a microwave launcher, configured to couple EM energy into a gas located in a vacuum chamber and thereby generate a surface-wave plasma. Providing an independent electromagnetic energy source at each plasma source node enables fine-tuning of the characteristics of the EM energy, e.g. the microwave frequency, power, and phase, supplied to the plasma locally at each node. The high degree of control over the plasma enables the plasma array to account for variations in the conditions at different locations within the vacuum chamber and thereby tailor the EM energy provided to the plasma from each EM launch structure to promote desired plasma characteristics.

FIG. 1 depicts a surface-wave plasma 20 extending radially outward from a microwave launch structure 21. The surface-wave plasma is generated near (approximately a few millimeters) the surface of the vacuum chamber 23. A Langmuir probe 22 located in the vacuum chamber 23 measures plasma density and plasma temperature. In the embodiment depicted in FIG. 1, plasma densities exceeding $10^{12}$ cm$^{-3}$ and electron temperatures less than 1.5 eV were measured for argon plasma at 1 Torr of pressure and 100 W input power.

Figure 2:
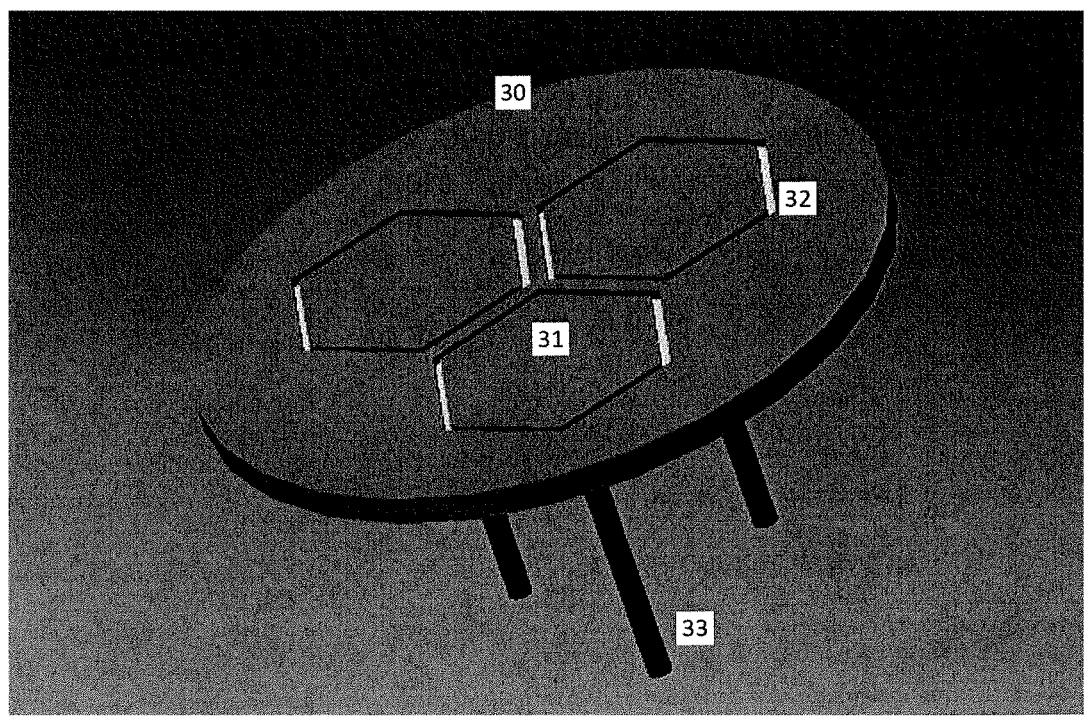
FIG. 2 depicts an array of microwave launch structures configured to generate a surface-wave plasma.

FIG. 2 depicts an array of microwave launch structures configured to generate a surface-wave plasma. The array of microwave launch structures depicted in FIG. 2 includes individual microwave launch structures 31 disposed in slots 32 on conducting plate 30. The conducting plate may be constructed from, e.g., aluminum or hard-anodized aluminum. The array of microwave launch structures depicted in FIG. 2 is a hexagonal configuration that can be scaled such that there is an orderly or regular pattern between launchers to generate overlapping plasma over a large area.

Figure 3:
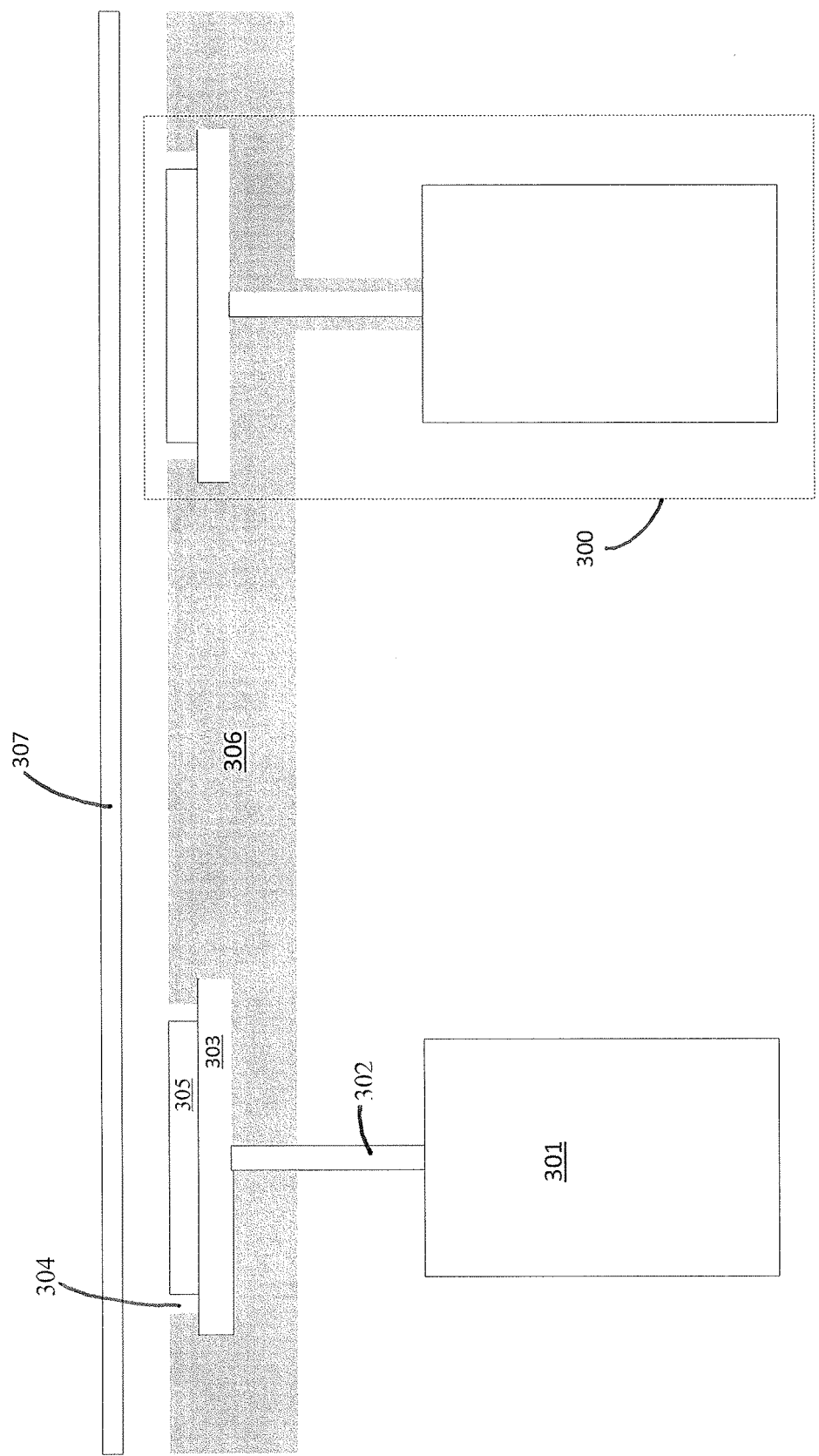
FIG. 3 depicts an independently controlled electromagnetic energy launch structure for providing electromagnetic energy into a surface wave plasma.

FIG. 3 depicts an independently controlled electromagnetic energy launch structure for providing electromagnetic energy into a surface wave plasma. In the embodiment depicted in FIG. 3, the independently controlled electromagnetic energy launch structure is a microwave launch structure 300. The microwave launch structure 300 includes a microwave generator 301, a coaxial feedthrough 302, a dielectric channel 303, radiating slots 304, a patch antenna 305, and a conducting baseplate 306. The coaxial feedthrough 302, which is impedance matched with the other components of the microwave launch structure 300, couples microwave energy provided by the microwave generator 301 into the dielectric channel 303 thereby inducing oscillations in the patch antenna 305 and launching electromagnetic energy through the radiating slots 304 to drive production of the plasma 307. Characteristics of the components of the microwave launch structure 300 are optimized with respect to one another to enable production of desirable plasma characteristics and to maximize the energy coupling efficiency.

The density of ions between the microwave launch structure 300 and the high-density surface wave plasma 307 varies continuously from near zero at the edge of the conducting baseplate 306 to greater than the critical density near the high-density surface wave plasma 307. The ion density gradient between the microwave launch structure 300 and the high-density surface wave plasma 307 causes gradients in the index of refraction and in the conductivity within the vacuum chamber above the baseplate 306. These gradients create a conductive plasma cladding that effectively forms a dielectric slab waveguide along with the conducting baseplate 306. The wave guide created by the conductive plasma cladding and the conducting baseplate 306 directs the electromagnetic energy launched from the microwave launch structure 300 radially away from the patch antenna 305.

Figure 4:
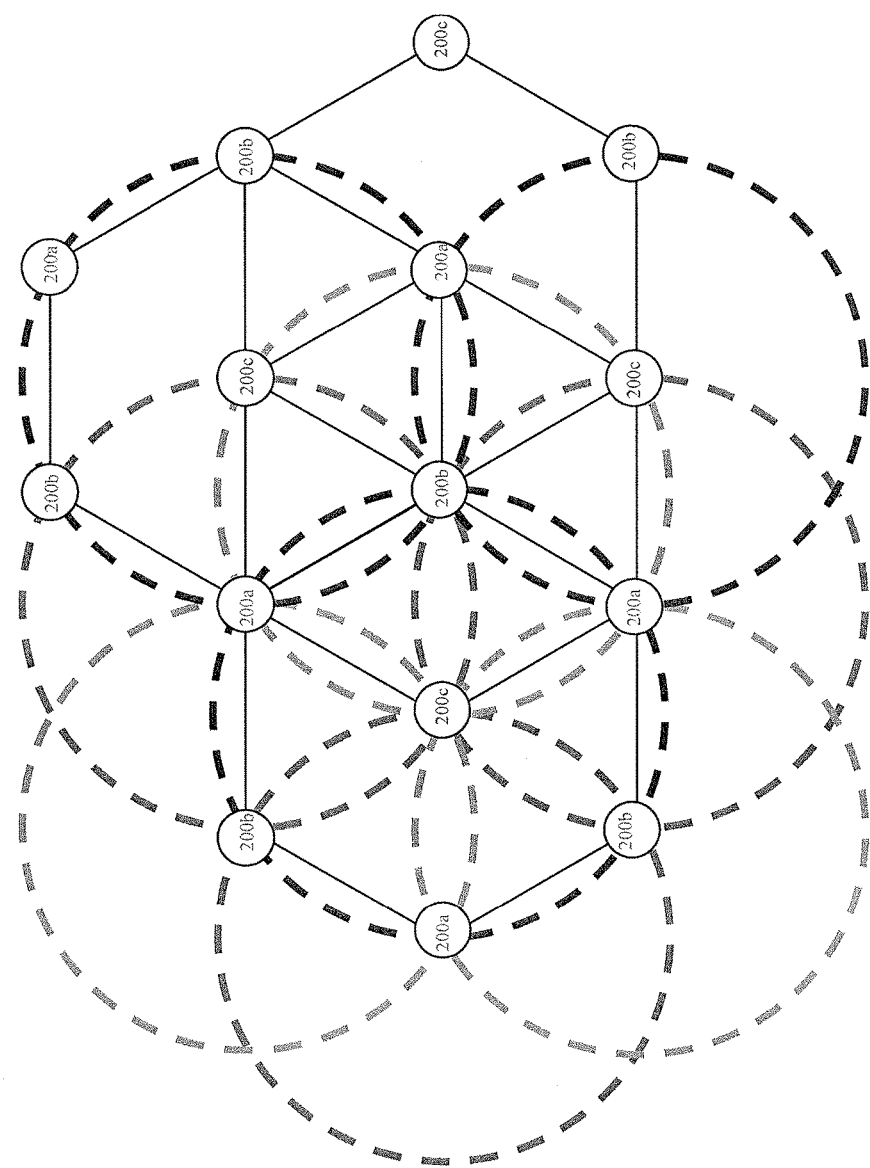
FIG. 4 depicts a hexagonal multiplex architecture for a system for generating a surface wave plasma.

In FIG. 4, surface-wave plasma generation nodes 200 are disposed in a hexagonal pattern to produce plasma. Each plasma generation node corresponds to a microwave launch structure mated to a microwave generator source either directly attached to the feed mechanism or located some distance away by cable or waveguide. Each microwave generator can be individually controlled to throttle microwave power supplied by each microwave launch node to the plasma. This allows customization of the EM power distribution in the plasma processing reactor. In the 300/450-mm circular wafer configuration, a hexagonal pattern with 7 or 19 hexagons is used. For a simple hexagonal setup with 1 in the center and 6 surrounding it, the central feed can be throttled down in power to yield a more uniform power distribution across the wafer for improved plasma uniformity. The positioning and separation distance between the nodes can help generate more uniform plasma over the large-area surface. If the microwave generators employed are low-cost magnetron sources, e.g. low-cost magnetron sources found in microwave ovens, they can be patterned with 3-fold symmetry to produce overlapping fields of plasma coverage while operated with standard 3-phase industrial power. At any time, plasma can completely cover a region while 2 of the 3 phases are firing. Overlapping surface wave plasmas generated by other microwave launch structures form a continuous sheet of plasma over a large area. The resulting surface wave is attenuated exponentially by the higher conductivity plasma cladding, creating an efficient source of low-temperature, high-density plasma. Lower-cost fixed-frequency AC generators, such as a magnetron resonator, can also be used for microwave generation. Three-phase power is supplied to alternating sets of the plasma source nodes 200 A,B, and C such that any two sets of microwave launchers are powered at any time providing plasma coverage over the processing reactor.

Figure 5:
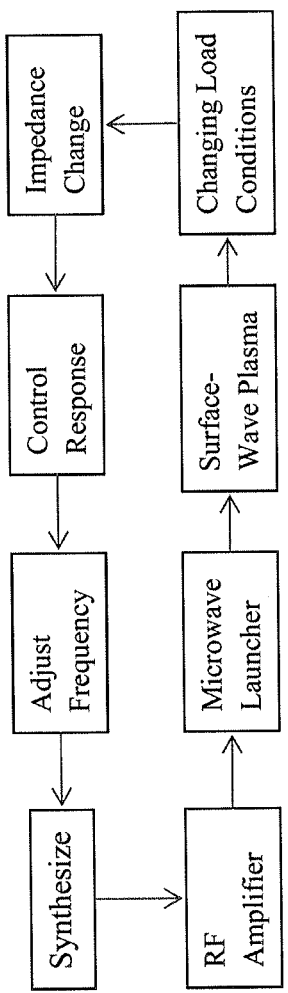
FIG. 5 is a flow diagram illustrating a control loop for adjusting a microwave drive frequency fed into a microwave launch structure that radiates microwave energy into a surface wave plasma.

FIG. 5 is a flow diagram illustrating a control loop for adjusting a microwave drive frequency fed into a microwave launch structure that radiates microwave energy into a surface wave plasma. The control loop depicted in FIG. 5 employs solid state amplifiers to analyze the standing wave ratio at the RF amplifier output, and using on-board power sensing, determine a change in the system impedance and plasma load. The control loop thereby provides for tuning of microwave drive frequency to enable frequency-based impedance matching between the microwave launch structure and the surface wave plasma. If surface wave plasma conditions change due to, e.g. introduction of processing gases or changes in pressure, an external control system can rapidly adjust the microwave drive frequency fed into the microwave launch structure to ensure that optimal microwave power is coupled into the surface wave plasma. In control systems described herein, frequency-based impedance matching can be achieved in a timescale on the order of 1-10 μs. Solid state amplifiers an analyze the standing wave ratio at the RF amplifier output, using on-board power sensing, to determine a change in the system impedance and plasma load. If process gases, pressure, or other conditions change in the surface-wave plasma reactor, the impedance change is sensed and the frequency of radiation generated by the microwave launcher is adjusted to return the measured impedance to a more optimal value for the microwave launcher. With frequency matching, gas species such as $O_2$, $N_2$, Ar, and $CH_4$ can be varied while maintaining a matched load condition.

The conducting surface of an array of plasma source nodes described herein can be covered by or embedded in a dielectric material. Adjusting the thickness of the dielectric material disposed between the plasma source nodes and the surface wave plasma provides an additional mechanism by which the EM energy provided to the plasma from each EM launch structure can be tailored to achieve desired plasma characteristics.

Figure 6:
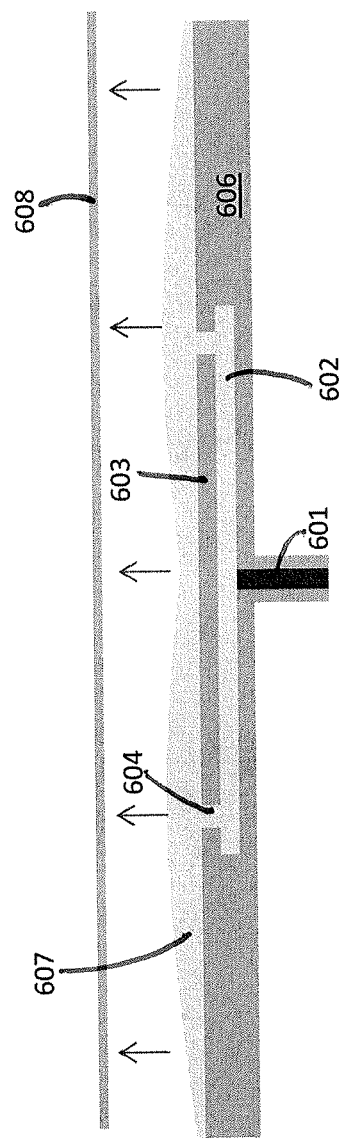
FIG. 6 depicts a microwave launch structure utilized in the production of a surface wave plasma that incorporates a graded dielectric for electric field smoothing.

FIG. 6 depicts a microwave launch structure utilized in the production of a surface wave plasma that incorporates a graded dielectric for electric field smoothing. The microwave launch structure 600 includes an impedance matched coaxial feedthrough 601, a dielectric channel 602, a patch antenna 603, radiating slots 604, a conducting baseplate 606, and a functionally graded dielectric 607. The functionally graded dielectric 607 has a non-uniform thickness that varies at different points above the plane in which the conducting baseplate 606 lies.

During operation, EM energy propagates between the conducting baseplate 606 and the surface wave plasma 608 through the functionally graded dielectric 607. In regions where the functionally graded dielectric 607 is relatively more thick, there is a higher effective capacitance and the electric potential gradient between the in a direction will be lower and energy absorbed in the plasma 608 will be less. As a result, relatively larger quantities of EM energy will propagate in a radial direction away from the microwave launch structure 600. Since the EM energy density will decrease as the effective plasma area goes up, the edges of the plasma will exhibit lower density than the center of the plasma near the microwave launcher 600 where the electric field is highest. Using a properly graded dielectric lowers the electric field limiting high field region allowing energy to propagate radially through the in radius improving plasma uniformity. This technique can be combined with other approaches for power control, such as throttling one microwave launcher relative to another to adjust plasma density profile.

Gas injection inlets, such as a porous dielectric, co-located at or near each microwave launcher and are described herein and disposed in a particular distribution relative to the plasma source nodes. Gas manifolds or distributors for directing gas flow can be co-located with the gas injection inlets. During solar photovoltaic processing, a surface wave plasma generator according to an embodiment of the invention can transition from performing PECVD to etching, to texturing light scattering and absorbing features by adjusting the mixture of gases in the plasma vacuum chamber.

Figure 7:
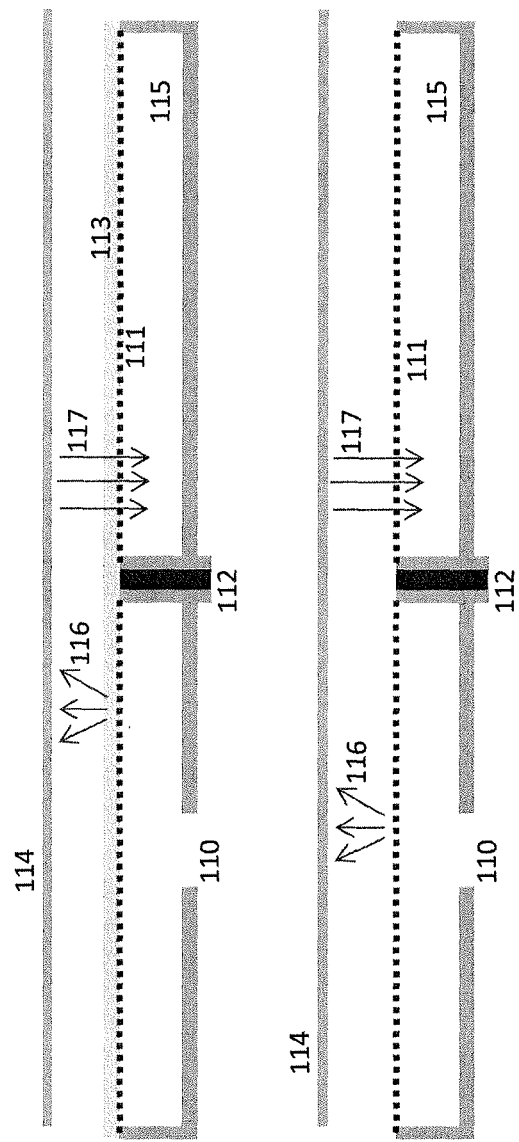
FIG. 7 illustrates an embodiment for incorporating gas injection and pumping through porous media or semi-transparent metal layer co-located with the surface-wave plasma generation zone.

FIG. 7 depicts an embodiment for incorporating gas injection and gas pumping through porous media or semi-transparent metal layer co-located with the surface-wave plasma generation zone. Microwave launcher 112 is connected to a gas plenum or manifold 115 having an inlet/exhaust 110. A conducting semi-transparent layer 111 forms the conducting base plate for the E-M energy to propagate radially forming the surface-wave plasma 114. Process gases 116 diffuse from the plenum 115 through the perforated plate 111 and diffuse through the porous dielectric 113 into the plasma zone. Due to the small aperture size of the semi-transparent plate 111 compared to the plenum 115 there is near-uniform injection into dielectric material 113. Diffusion through the porous material 113 further distributes the process gases 116 for injection into the plasma region 114. Similarly, etchant gases 117 can reverse the process and be pumped from the system, passing through the porous dielectric 113 and/or the semi-transparent plate 111. In this embodiment, process gases provide improved etching or deposition uniformity on the substrate (not pictured).

Since the surface wave will set up and form along the surface co-located with the microwave launch structure, gas injection can be co-located at or near the microwave launcher. Process gases can be injected through a porous dielectric, e.g. alumina. The presence of a dielectric between the plasma and the that serves to limit plasma losses to electrodes and maintain cleanliness in the system. A porous injector can be co-located with a gas manifold or distributor to direct flow in a particular distribution relative to the microwave plasma launchers. Alternatively, a porous plate can be used. If localized discharging and hollow-cathode-like effects are to be mitigated, the diameter of the pores or holes should be less than a few Debye lengths or sheath distances to inhibit the formation of bulk plasma in these regions, e.g. <0.020" diameter. In the preferred embodiment, a hard-anodized aluminum mesh plate is utilized with 0.020" holes for gas injection and removal. This is good for large-area processing in a shallow-narrow gap configuration, e.g. solar panel processing. For etching applications, a similar mesh plate can be used for pumping and removing process gases over a large area to minimize the recycling of etch products passing through the surface-wave plasma region; this allows board-area scaling.

An all-in-one, high-throughput surface wave plasma (SWP) processing system for production of a-Si:H/c-Si heterojunction solar cells described herein provides a single vacuum chamber and platform in which sequential photovoltaic manufacturing steps are integrated. The processing system described herein enables saw damage removal, nanoscale surface texturing, and a-Si deposition to be performed in a single vacuum chamber. The value propositions of such an "all-in-one" surface-wave plasma processing tool are: (1) lower manufacturing cost and higher throughput by combining processing steps into one; (2) eliminating machines to lower capital equipment cost; (3) all dry process to reduce environmental impact by eliminating wet chemical etch processing; (4) wafer surface cleanliness is guaranteed by isolating the substrate in a single chamber from the beginning of the manufacturing process to the end; (5) damage-free low-temperature (e.g. less than 200° C.) processing to inhibit epitaxial growth for atomically-sharp interfaces; and (6) providing a nanotexturing process to reduce Si loss, reduce surface reflection, and increase conversion efficiency and energy yield.

Figure 8:
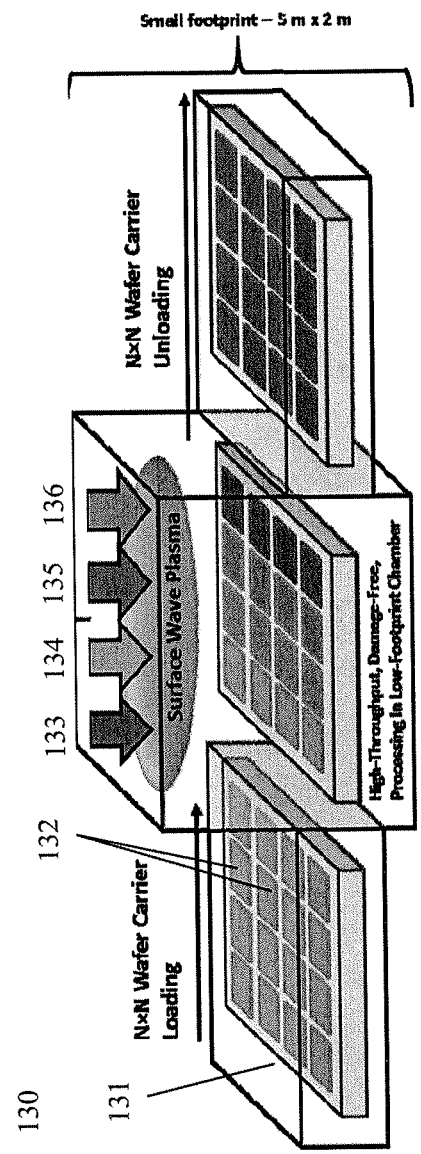
FIG. 8 shows a conceptual illustration of an all-in-one processing station for photovoltaic cell manufacturing.

FIG. 8 shows a conceptual illustration of an all-in-one processing station 130 for photovoltaic cell manufacturing. A wafer carrier 131 is loaded with raw, cut silicon wafers 132 from a supplier and loaded into the surface-wave reactor. The wafer carrier 131 can also serve as the physical support for the completed module and serve to isolate each wafer 132. The surface-wave reactor first performs a deep etch to remove macroscopic damage from the operation to make the thin wafers 133, then performs a nanotexturing step(s) 134, then it performs a surface preparation and cleaning step 135, then deposits thin-film semiconducting layers and dopant layers 136 and then either deposits capping layers or transparent conductive oxide layers or other steps.

In solar photovoltaic processing, switching processing gases and shifting the plasma chemistry enables the surface wave reactor to transition from depositing intrinsic and doped semiconductors, to etching to texturing light scattering and absorbing features. Texturization can be accomplished by a variety of means including physical masking, gas-flow "wave" like texturing or in-situ reactive chemistries, such as the Omni Black nanotexturing process pioneered by Effimax Solar that forms regularly spaced silicon cones by a cooperative nano-mask and nano-etch process for light absorption since the scattering is omnidirectional—an ideal property not available for wet pyramidal shapes found with conventional solar cells. Again a variety of processing gases can be used to achieve the desired effect with attention to etch selectivity for different materials, e.g. a mask.

After the texturization step is completed, the process gas is changed again in a continuous manner to transition to amorphous silicon deposition onto the nanotextured wafer substrate. Thin, intrinsic layers of a-Si and doped a-Si, e.g. 5-20 nm, can be deposited at low temperature to form the heterojunction and emitter contact layers. By changing gas chemistry to introduce phosphine, diborane or other dopant gas, the semiconductor properties can be adjusted to yield junctions for photovoltaic performance. Selection of surface texturing or nanotexturing with appropriate structure is important to minimize voids or improper step coverage with a-Si fill.

Lastly the transparent conducting oxide, e.g. ITO or ZnO, can be deposited for surface passivation and emitter-collector area is deposited. This is traditionally done with sputtering, but other methods are available including atomic-layer deposition and plasma processes that could leverage the same process station for a true all-in-one system. A key aspect is that the entire process occurs in a vacuum system to minimize contaminants, oxide growth, wafer handling and other steps that could compromise efficiency and manufacturing yield. The process can start and morph on the fly by changing power level, process gases, flow rates, chamber pressure, etc. to achieve a near-continuous process.

Operation of the surface-wave plasma generator can be achieved with dynamic adjustment of process gases for continuous processing on the fly. For example, a cleaning process with $O_2$ plasma could start and then be followed with a $H_2$ plasma etch and followed with a $NF_3$ etch to remove different contaminants, prepare a surface for processing and then do a silicon etch. Or a surface could be cleaned, activated, and a thin-film deposited—all with the same surface-wave tool since plasma can be dynamically adjusted in real-time.

Figure 9:
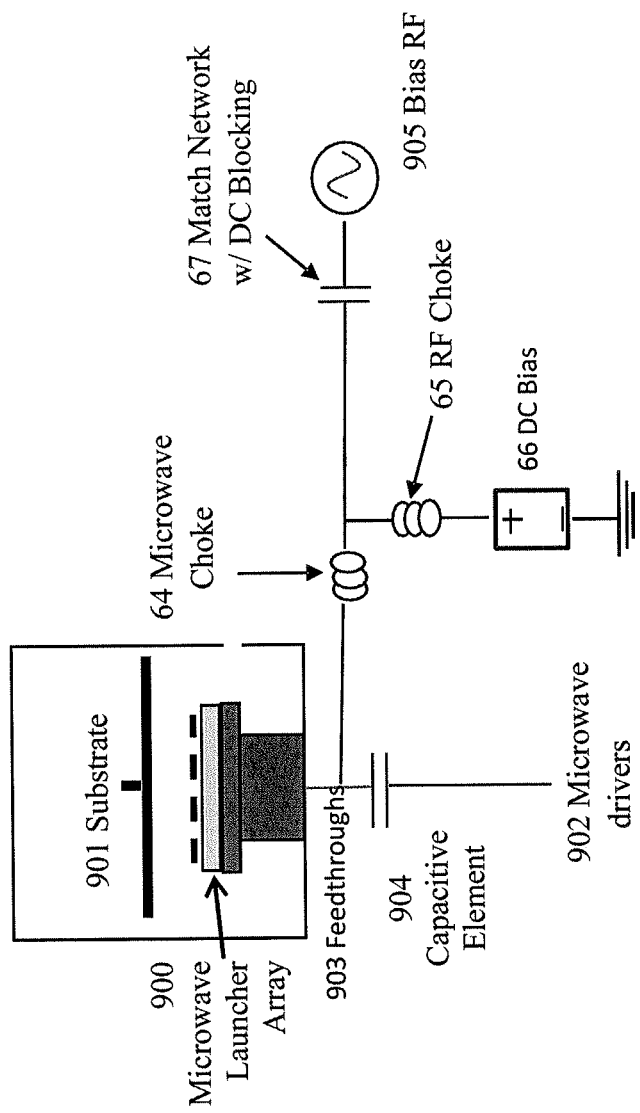
FIG. 9 is a diagram of an apparatus for producing an independently biased surface-wave plasma.

FIG. 9 is a diagram of an apparatus for producing an independently biased surface-wave plasma. The apparatus diagramed in FIG. 9 includes a microwave launcher array 900 in close proximity to a process substrate 901. Microwave drivers 902 supply microwave energy to the microwave launcher array 900 through suitable impedance-matched feedthroughs 903. A capacitive element 904 is disposed between the microwave drivers 902 and the impedance-matched feedthroughs 903. The capacitive element 904 allows the formation and maintenance of an electric potential difference between the microwave launcher array 900 and the microwave drivers 902. The capacitive element 904 thereby allows the microwave drivers 902 to remain at ground potential while the microwave launcher array 900 is provided with an electric potential bias from an RF bias source 905.

The apparatus diagramed in FIG. 9 allows the surface-wave plasma to be biased independently of the process substrate 901. In operation, the microwave launcher is biased with RF energy provided by the RF bias source 905 that has a much smaller frequency (e.g. 2 MHz) than the microwave energy supplied by the microwave drivers 40 (2.45 GHz microwaves). Pass filters and blocking chokes, allow simultaneous application of plasma generating microwave energy from the microwave drivers 902 and plasma biasing RF energy from the RF bias source. Specifically, choke 64 placed in line with feedthrough 903 to prevent microwave energy from propagating upstream to biasing elements 66 and 905. A DC bias power source 66 is connected to the line to provide a voltage to the scalable array 900. Alternatively, an RF bias source 905 can be connected to the line to provide a low-frequency RF bias effect to the plasma. In either case, a blocking RF choke 65 is included to prevent bias RF 905 from affecting the power supply 66 or a DC blocking capacitor 67 placed in line to protect the RF bias 905 from DC potential. A conventional matching network could be utilized at 67 to efficiently deliver power from 905 to the scalable array 900. This allows the substrate to be completely free from the system. The RF sheath action generates a net DC bias and can accelerate ions to a tunable energy. Alternatively, the substrate can be biased in the traditional fashion.

Figure 10:
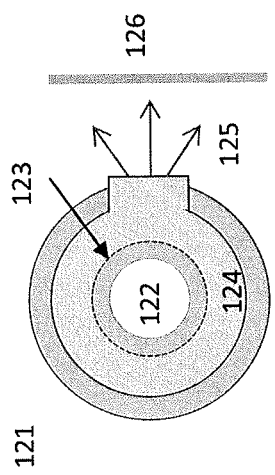
FIG. 10 depicts a coaxial configuration for generating a surface-wave plasma having a cylindrical geometry.

Alternative geometries for surface-wave generation can be achieved with non-planar shapes and injection means. In one embodiment, the surface-wave source uses a ring shape to generate plasma to treat cylindrical shaped objects or for plasma/radical generation long a tube. Process gases can be fed into a ring shape; microwaves can provide surface wave action and uniform treatment can be achieved on parts. An alternative geometry concept away from planar is to use a ring shape, such that the surface-wave generator is able to treat cylindrical objects such as pipes, tubing or wafers. In another embodiment, a coaxial microwave launch structure is adapted onto a standard industry vacuum flange to mount onto a process chamber to introduce both flowing gas and plasma into a chamber. This configuration is well suited for smaller processing stations, such as atomic layer deposition systems FIG. 10 depicts a system for generating a surface wave plasma configured for treating cylindrical objects. FIG. 10 a shows an alternate configuration where the surface-wave plasma zone 126 is bent into a annular ring vs. a planar shape for the treatment of tubular objects, semiconductor wafers or other such materials. Microwave energy is fed into the annular source 120 through impedance-matched feedthroughs (not shown) into an annular antenna structure 122 surrounded with an insulating dielectric 124 and outer conductor 121. Process gases 126 are either fed external to the microwave launcher 120 or fed directly through the center conductor 122 with small apertures 123 providing gas exit directly into the chamber or through a porous dielectric 125.

Figure 11:
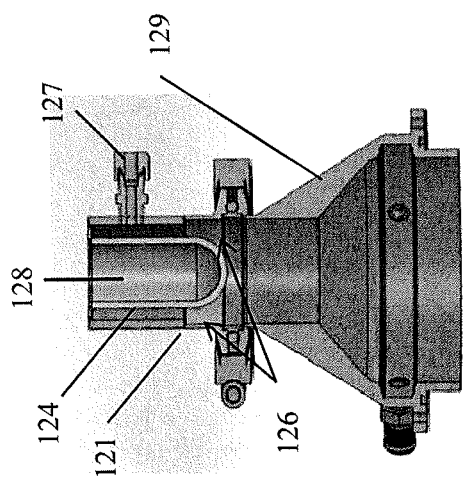
FIG. 11 depicts a coaxial configuration where the surface wave plasma zone 126 is formed around a rod or tube shaped insulating dielectric.

FIG. 11 depicts a coaxial configuration where the surface wave plasma zone 126 is formed around a rod or tube shaped insulating dielectric 124 with process gases fed into a manifold 127 to generate flow through the outer conductor 121. The impedance-matching microwave coupling cavity 128 converts electromagnetic energy from a remove antenna, such as a magnetron or the annular antenna structure 122 of Fig, through a hermitic ceramic-metal seal. The entire structure can be mounted to a standard vacuum adapter, such as a KF50 or 2¾" Conflat, for easy use.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the invention covers further embodiments with any combination of features from different embodiments described above and below.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A surface-wave plasma source for generating a surface wave plasma, the surface-wave plasma source comprising:
 a microwave launch structure comprising:
  a dielectric insulator layer,
  a patch antenna adjacent the dielectric insulator layer,
  a conducting baseplate,
  a microwave signal generator providing a microwave frequency output signal, and
  an impedance matching feedthrough signally coupling the microwave frequency output signal to the patch antenna,
  wherein the patch antenna and conducting baseplate are arranged to provide radiating slots in a space comprising a dielectric material between the patch antenna and the conducting baseplate,
  wherein the microwave signal generator is configured to operate, in accordance with a control loop, to vary a frequency of the microwave frequency output signal, and
  wherein the microwave signal generator is configured to operate, in accordance with the control loop, to provide a plasma turn-on and an impedance matching in a response time in an order of 1 microsecond to 10 microseconds.

2. The surface-wave plasma source of claim 1, wherein the patch antenna and dielectric insulator layer are in a physical configuration taken from the group of geometries consisting of: planar, coaxial, and ring shape.

3. The surface-wave plasma source of claim 1 further comprising a plurality of the microwave launch structure, the plurality of the microwave launch structure being arranged in one of the group of periodic arrangements consisting of a periodic structure to generate overlapping plasma zones to approximate a uniform plasma sheet.

4. The surface-wave plasma source of claim 3 wherein the microwave signal generator is configured to tailor plasma properties of the surface wave plasma over a process substrate, the tailoring being affected by adjusting one of the group consisting of: power, frequency and phase of the microwave frequency output signal.

5. The surface-wave plasma source of claim 1, wherein the frequency of the microwave frequency output signal is adjusted to change overall circuit impedance arising from a changed plasma load condition.

6. The surface-wave plasma source of claim 1 wherein the control loop is configured to sense a change in system impedance.

7. The surface-wave plasma source of claim 6 wherein the frequency is varied, in accordance with the change in system impedance, to affect impedance matching between the first microwave launch structure and the surface wave plasma.

8. The surface-wave plasma source of claim 1 wherein the control loop is configured to sense changes in a plasma load of the surface wave plasma.

9. The surface-wave plasma source of claim 1 wherein the microwave launch structure further comprises a dielectric channel, fanned on an adjacent surface of the patch antenna opposite the dielectric insulator layer, the dielectric channel providing a spacing between the patch antenna and the conducting baseplate.

10. The surface-wave plasma source of claim 1, wherein the patch antenna and dielectric insulator layer are formed as a ring shape physical configuration.

11. A surface-wave plasma source for generating a surface wave plasma, the surface-wave plasma source comprising:
    a microwave launch structure comprising:
        a dielectric insulator layer,
        a patch antenna adjacent the dielectric insulator layer,
        a conducting baseplate,
        a dielectric channel, formed on an adjacent surface of the patch antenna opposite the dielectric insulator layer, the dielectric channel providing a spacing between the patch antenna and the conducting baseplate,
        a microwave signal generator providing a microwave frequency output signal, and
        an impedance matching feedthrough signally coupling the microwave frequency output signal to the patch antenna,
        wherein the patch antenna and conducting baseplate are arranged to provide radiating slots in a space between the patch antenna and the conducting baseplate, and
        wherein the dielectric insulator layer is functionally graded in a varying thickness over a surface of the patch antenna.

12. The surface-wave plasma source of claim 11 wherein the dielectric insulator layer is functionally graded to have a greater thickness at an edge of the patch antenna, which forms the radiating slots, in relation to a thickness of the dielectric insulator layer at an inner area of the of the patch antenna.

13. The surface-wave plasma source of claim 11 wherein the dielectric insulator layer is functionally graded in a varying thickness over a surface of the conducting baseplate.

14. The surface-wave plasma source of claim 11, wherein the patch antenna and dielectric insulator layer are in a physical configuration taken from the group of geometries consisting of: planar, coaxial, and ring shape.

15. The surface-wave plasma source of claim 11, wherein the patch antenna and dielectric insulator layer are formed as a ring shape physical configuration.

16. A surface-wave plasma source for generating a surface wave plasma, the surface-wave plasma source comprising:
    a microwave launch structure comprising:
        a dielectric insulator layer,
        a patch antenna adjacent the dielectric insulator layer,
        a conducting baseplate,
        a microwave signal generator providing a microwave frequency output signal, and
        an impedance matching feedthrough signally coupling the microwave frequency output signal to the patch antenna,
        wherein the patch antenna and conducting baseplate are arranged to provide radiating slots in a space comprising a dielectric material between the patch antenna and the conducting baseplate, and
        wherein the dielectric insulator layer is functionally graded in a varying thickness over a surface of the patch antenna.

17. The surface-wave plasma source of claim 16, wherein the patch antenna and dielectric insulator layer are in a physical configuration taken from the group of geometries consisting of: planar, coaxial, and ring shape.

18. The surface-wave plasma source of claim 16, wherein the patch antenna and dielectric insulator layer are formed as a ring shape physical configuration.

19. A surface-wave plasma source for generating a surface wave plasma, the surface-wave plasma source comprising:
    a microwave launch structure comprising:
        a dielectric insulator layer,
        a patch antenna adjacent the dielectric insulator layer,
        a conducting baseplate,
        a microwave signal generator providing a microwave frequency output signal, and
        an impedance matching feedthrough signally coupling the microwave frequency output signal to the patch antenna,
        wherein the patch antenna and conducting baseplate are arranged to provide radiating slots in a space comprising a dielectric material between the patch antenna and the conducting baseplate, and
    wherein the surface-wave plasma source utilizes a structure, for gas injection or gas removal under a formation zone of the surface wave plasma, the structure taken from the group consisting of: a porous dielectric material and a porous metal material.

20. The surface-wave plasma source of claim 19, wherein the patch antenna and dielectric insulator layer are in a physical configuration taken from the group of geometries consisting of: planar, coaxial, and ring shape.

21. The surface-wave plasma source of claim 19, wherein the patch antenna and dielectric insulator layer are formed as a ring shape physical configuration.

22. The surface-wave plasma source of claim 19, wherein the structure is a porous injector co-located with a gas manifold or distributor to direct flow in a particular distribution relative to the microwave launch structure.

23. The surface-wave plasma source of claim 19, wherein the structure has holes less than or equal to 0.020 inches in diameter.

24. An integrated photovoltaic module processing station comprising:
   a surface-wave plasma source comprising a plurality of a microwave launch structure, each one of the plurality of the microwave launch structure comprising:
      a dielectric insulator layer,
      a patch antenna adjacent the dielectric insulator layer,
      a conducting baseplate,
      a dielectric channel, formed on an adjacent surface of the patch antenna opposite the dielectric insulator layer, the dielectric channel providing a spacing between the patch antenna and the conducting baseplate,
      a microwave signal generator providing a microwave frequency output signal, and
      an impedance matching feedthrough signally coupling the microwave frequency output signal to the patch antenna,
      wherein the patch antenna and conducting baseplate are arranged to provide radiating slots in a space comprising a dielectric material between the patch antenna and the conducting baseplate,
      wherein the microwave signal generator is configured to operate, in accordance with a control loop, to vary a frequency of the microwave frequency output signal;
   a wafer carrier; and
   a gaseous precursor and carrier gas injection and pumping subsystem.

25. The station of claim 24, wherein the surface-wave plasma source and the wafer carrier are configured to simultaneously process an M×N array of wafers.

26. The station according to claim 25 wherein the wafer carrier is an integral component of the station.

27. The surface-wave plasma source of claim 24, wherein the patch antenna and dielectric insulator layer are in a physical configuration taken from the group of geometries consisting of: planar, coaxial, and ring shape.

28. The surface-wave plasma source of claim 24, wherein the patch antenna and dielectric insulator layer are formed as a ring shape physical configuration.

* * * * *